United States Patent [19]
Ito

[11] Patent Number: 6,028,474
[45] Date of Patent: Feb. 22, 2000

[54] SEMICONDUCTOR INTEGRATED CIRCUIT

[75] Inventor: Masahiro Ito, Hamamatsu, Japan

[73] Assignee: Yahama Corporation, Hamamatsu, Japan

[21] Appl. No.: 08/937,013

[22] Filed: Sep. 24, 1997

[30] Foreign Application Priority Data

Sep. 26, 1996 [JP] Japan .................................. 8-254966

[51] Int. Cl.$^7$ .............................................. H03K 19/0175

[52] U.S. Cl. .......................... 327/544; 327/530; 327/108; 326/38; 326/86

[58] Field of Search .................................... 327/108, 544, 327/546, 530, 437; 326/30, 38, 86; 365/185.12

[56] References Cited

U.S. PATENT DOCUMENTS

| | | | |
|---|---|---|---|
| 4,906,862 | 3/1990 | Itono et al. | 365/185.17 |
| 5,594,362 | 1/1997 | Owen | 326/38 |
| 5,682,105 | 10/1997 | Fujima | 327/313 |

*Primary Examiner*—Dinh Le
*Attorney, Agent, or Firm*—Graham & James LLP

[57] ABSTRACT

A semiconductor integrated circuit includes an input buffer circuit that has an input terminal connected to an external signal input pad. A level-setting resistor is arranged between the input buffer circuit and a reference potential terminal having a reference potential, for holding the input terminal at the reference potential. The level-setting resistor comprises a transistor that is supplied with a control signal, and set to an off state by the control signal when the external signal input pad is in a predetermined potential state.

4 Claims, 5 Drawing Sheets

SEMICONDUCTOR INTEGRATED CIRCUIT

BACKGROUND OF THE INVENTION

1. Field of the Invention

This invention relates to a semiconductor integrated circuit with an input buffer circuit having a power consumption-saving function.

2. Prior Art

FIG. 1 shows the arrangement of an input buffer circuit provided with a pull-up function, which is employed in a conventional MOS integrated circuit. The input buffer circuit 3 is constituted by CMOS inverters 3a and 3b arranged in two stages, with an input terminal thereof connected to an external signal input pad 1. The input terminal of the input buffer circuit 3 is also connected to an input protection circuit 2 formed by diodes D1 and D2, while a p-channel MOS transistor hereinafter referred to as "the PMOS transistors") QP0 as a pull-up resistor is connected between the input terminal and a power supply $V_{DD}$. The PMOS transistor QP0 has its gate grounded.

The PMOS transistor QP0 as the pull-up resistor is a type having a high ON-state resistance. This makes it possible to transmit changes in signal level at the external signal input pad 1 to the input buffer circuit 3, and at the same time hold the input terminal of the input buffer circuit 3 at the voltage of the power supply $V_{DD}$ without making the input terminal floating even when the external signal input pad 1 is made open.

The conventional input buffer circuit with a pull-up function shown in FIG. 1 cannot reduce the power consumption to a sufficiently low level for the following reasons, particularly when it is used in an integrated circuit with a power-down mode in which an internal circuit thereof is set to a power-saving state when the integrated circuit is on standby: First, when the external signal input pad 1 is grounded, for example, with the internal circuit in the power-down mode, a steady-state current flows from the power supply $V_{DD}$ through the PMOS transistor QP0 as the pull-up resistor to the external signal input pad 1 which is grounded. Secondly, if the internal circuit is set to the power-down mode when the signal level at the external signal input pad 1 undergoes changes between an "L" level and an "H" level, the inverters 3a and 3b of the input buffer circuit 3 repeatedly make a state transition, which causes a current to flow through the input buffer circuit 3 in each transitional state.

SUMMARY OF THE INVENTION

It is an object of the invention to provide a semiconductor integrated circuit which is capable of reducing the power consumption by an input buffer circuit employed therein, particularly when the semiconductor integrated circuit is in a power-down mode.

To attain the above object, according to a first aspect of the invention, there is provided a semiconductor integrated circuit including an input buffer circuit having an input terminal connected to an external signal input pad, a reference potential terminal that has a reference potential, and a level-setting resistor that is arranged between the input buffer circuit and the reference potential terminal, for holding the input terminal at the reference potential.

The semiconductor integrated circuit according to the first aspect of the invention is characterized in that the level-setting resistor comprises a transistor that is supplied with a control signal, and set to an off state by the control signal when the external signal input pad is in a predetermined potential state.

Preferably, the reference potential terminal is connected to a power source having a predetermined positive voltage, the transistor being set to the off state by the control signal when the external signal input pad is at a low level potential.

Alternatively, the reference potential terminal is grounded, the transistor being set to the off state by the control signal when the external signal input pad is at a high level potential.

To attain the above object, according to a second aspect of the invention, there is provided a semiconductor integrated circuit including an input buffer circuit having an input terminal connected to an external signal input pad, a reference potential terminal that has a reference potential, and a level-setting resistor that is arranged between the input buffer circuit and the reference potential terminal for holding the input terminal at the reference potential, the semiconductor integrated circuit being capable of being set to a power-down mode.

The semiconductor integrated circuit according to the second aspect of the invention is characterized in that the level-setting resistor comprises a transistor that is set to an off state by a control signal for setting the semiconductor integrated circuit to the power down mode.

To attain the above object, according to a third aspect of the invention, there is provided a semiconductor integrated circuit including an input buffer circuit having an input terminal connected to an external signal input pad, a reference potential terminal that has a reference potential, and a level-setting resistor that is arranged between the input buffer circuit and the reference potential terminal, for holding the input terminal at the reference potential.

The semiconductor integrated circuit according to the third aspect of the invention is characterized by comprising a state-determining device that determines whether the external signal input pad is in a predetermined potential state, to generate a control signal when the external signal input pad is in the predetermined potential state, the level-setting resistor comprising a transistor that is set to an off state by the control signal.

To attain the above object, according to a fourth aspect of the invention, there is provided a semiconductor integrated circuit including an input buffer circuit having an input terminal connected to an external signal input pad, a reference potential terminal that has a reference potential, and a level-setting resistor that is arranged between the input buffer circuit and the reference potential terminal, for holding the input terminal at the reference potential.

The semiconductor integrated circuit according to the fourth aspect of the invention is characterized by comprising a signal state-determining device that determines whether a level of an input signal applied to the external signal input pad is actively changing under predetermined conditions, to generate a control signal when the level of the input signal applied to the external signal input pad is actively changing under the predetermined conditions, the level-setting resistor comprising a transistor that is set to an off state by the control signal.

To attain the above object, according to a fifth aspect of the invention, there is provided a semiconductor integrated circuit including an input buffer circuit having an input terminal connected to an external signal input pad, the semiconductor integrated circuit being capable of being set to a power-down mode.

The semiconductor integrated circuit according to the fifth aspect of the invention is characterized in that the input buffer circuit comprises a logical gate having a first stage, at least the first stage of the logical gate having an input terminal other than the input terminal connected to the external signal input pad and a control element that controls the input terminal other the input terminal connected to the external signal input pad in a manner such that a state transition of the first stage of the logical gate is inhibited from occurring when the semiconductor integrated circuit is set to the power-down mode.

To attain the above object, according to a sixth aspect of the invention, there is provided a semiconductor integrated circuit including an input buffer circuit having an input terminal connected to an external signal input pad, a reference potential terminal that has a reference potential, and a level-setting resistor that is arranged between the input buffer circuit and the reference potential terminal, for holding the input terminal at the reference potential, the semiconductor integrated circuit being capable of being set to a power-down mode by a first control signal.

The semiconductor integrated circuit according to the sixth aspect of the invention is characterized by comprising a state-determining device that determines whether the external signal input pad is in a predetermined potential state, and generates a second control signal depending on a result of the determination that the external signal input pad is in the predetermined potential state, and the first control signal, the level-setting resistor comprising a transistor that is set to an off state by the second control signal.

Preferably, the state-determining device determines whether the external signal input pad is open.

Preferably, the semiconductor integrated circuit further includes a signal state-determining device that determines whether a level of an input signal applied to the external signal input pad is actively changing under predetermined conditions, to generate a third control signal when the level of the input signal applied to the external signal input pad is actively changing under the predetermined conditions, the transistor of the level-setting resistor being set to the off state by the second control signal and the third control signal.

The above and other objects, features, and advantages of the invention will become more apparent from the following detailed description taken in conjunction with the accompanying drawings.

DETAILED DESCRIPTION

The invention will now be described in detail with reference to drawings showing embodiments thereof.

Figure 1:
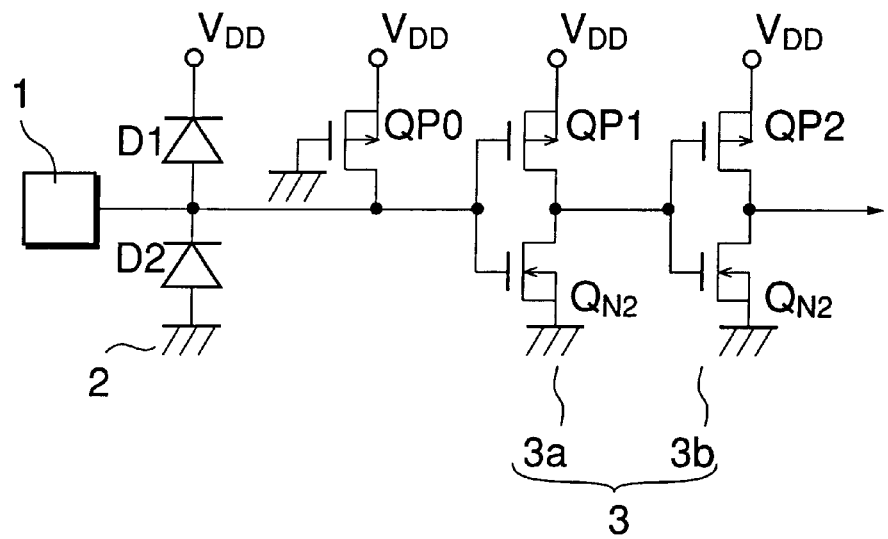
FIG. 1 is a circuit diagram showing the arrangement of an input buffer circuit equipped with a pull-up resistor, employed in a conventional semiconductor integrated circuit.
Figure 2:
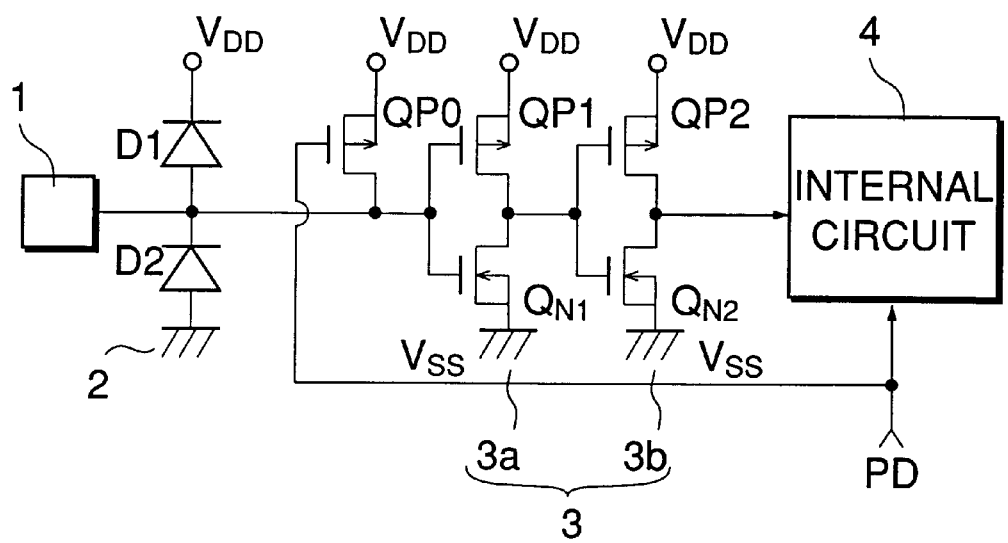
FIG. 2 is a circuit diagram showing essential parts of a semiconductor integrated circuit according to a first embodiment of the invention.

FIG. 2 shows the arrangement of essential parts of an input buffer circuit of a semiconductor integrated circuit according to a first embodiment of the invention. Component elements and parts corresponding to those of the input buffer circuit block of the conventional semiconductor integrated circuit shown in FIG. 1 are designated by identical reference numerals.

The input buffer circuit 3 of the semiconductor integrated circuit according to the present embodiment is constructed by CMOS inverters 3a and 3b, with an input terminal thereof connected to an external signal input pad 1. The input terminal is connected to an input protection circuit 2 formed by diodes D1 and D2, while a PMOS transistor QP0 as a pull-up resistor is interposed between the input terminal and a power supply $V_{DD}$. The input buffer circuit 3 has its output connected to an internal circuit 4 which is capable of being set to a power-down mode by a power-down control signal PD. The power-down control signal PD is also supplied to a gate of the PMOS transistor QP0 as the pull-up resistor, whereby the PMOS transistor QP0 is set to an OFF state when the circuit is in the power-down mode (PD="H").

With this configuration of the input buffer circuit according to the first embodiment, even if the potential at the external signal input pad 1 is held at "L" level due to grounding of the input pad 1 or the like during the power-down mode, no steady-state current flows through the PMOS transistor QP0 as the pull-up resistor, whereby wasteful power consumption is reduced.

Figure 3:
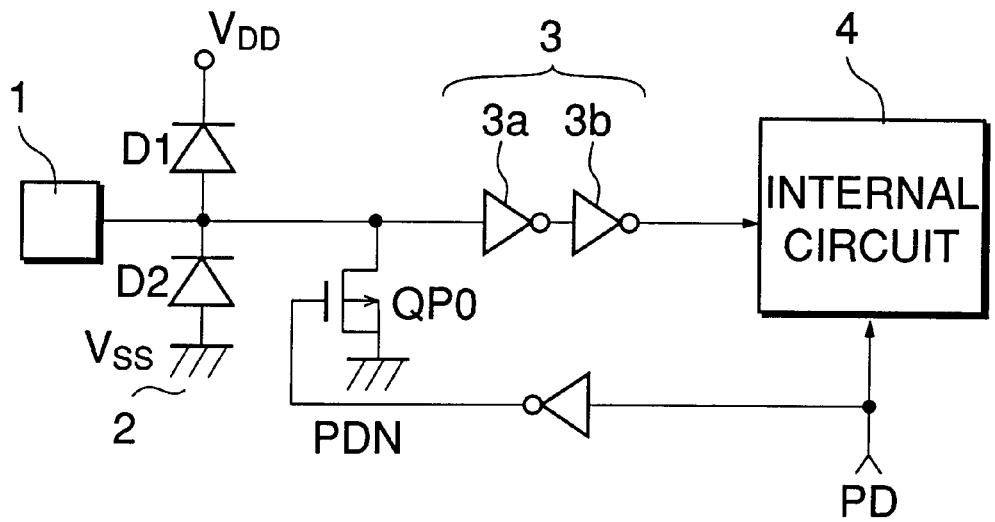
FIG. 3 is a diagram showing essential parts of a semiconductor integrated circuit according to a second embodiment of the invention.

FIG. 3 shows the arrangement of essential components forming an input buffer circuit of a semiconductor integrated circuit according to a second embodiment of the invention. In this embodiment, an n-channel MOS transistor (hereinafter referred to as "the NMOS transistor") QN0 as a pull-down resistor is arranged between the input terminal of the input buffer circuit 3 and a ground VSS. The NMOS transistor QN0 has a gate thereof controlled by an inverted control signal PDN of the power-down control signal PD for setting the power-down mode of the internal circuit 4. That is, the NMOS transistor QN0 is set to an OFF state during the power-down mode (PDN="L").

This configuration of the input buffer circuit according to the second embodiment prevents steady-state current from flowing through the NMOS transistor QN0 as the pull-down resistor even if the potential at the external signal input pad 1 is held at "H" level when the internal circuit is set to the power-down mode, whereby wasteful power consumption is minimized.

Third to fifth embodiments of the invention described hereinafter also use a PMOS transistor as the pull-up resistor, which corresponds to the PMOS transistor QP0 of the first embodiment shown in FIG. 2. However, the concepts of the following embodiments can be applied to the input buffer circuit using the NMOS transistor as the pull-up resistor according to the FIG. 3 embodiment.

The first and second embodiments are effective when it is known in advance that the potential at the external input external signal input pad 1 is held at "H" level or at "L" level during the power-down mode of the internal circuit. However, when the external signal input pad 1 is made open (i.e. disconnected from the external circuit) during the power-down mode, if the PMOS transistor QP0 as the pull-up resistor is turned off, the input terminal of the input buffer circuit 3 is brought into a floating state, which causes a current to flow through the first-stage inverter 3a.

Figure 4:
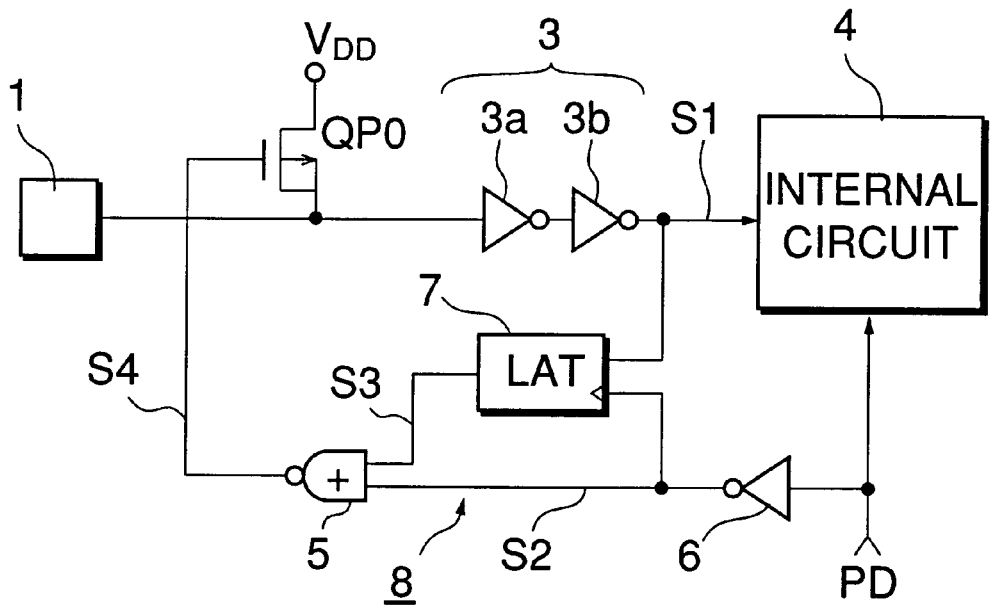
FIG. 4 is a circuit diagram showing essential parts of a semiconductor integrated circuit according to a third embodiment of the invention.

FIG. 4 shows the arrangement of essential parts of an input buffer circuit of a semiconductor integrated circuit according to the third embodiment, which provides a solution to the above-mentioned problem. This input buffer circuit includes, in addition to the components of the FIG. 2 embodiment, a state-determining device 8 arranged between the PMOS transistor QP0 and the internal circuit 4, for determining whether or not the external signal input pad 1 is connected to an active external device, and permitting the PMOS transistor QP0 as the pull-up resistor to be turned off depending upon results of the determination when the internal circuit 4 is set to the power-down mode by the power-down control signal PD. The state-determining device 8 is comprised of an inverter 6, a half latch 7 for latching an output signal S1 from the input buffer circuit 3 at the time of a fall of a signal S2 from the inverter 6 which inverts the power-down control signal PD, i.e. at the time of a transition to the power-down mode, and a NOR gate 5 which controls the gate of the PMOS transistor QP0 as the pull-up resistor according to results of logical comparison between an output signal S3 from the half latch 7 and the signal S2. The half latch 7 permits the signal S1 to pass therethrough as it is when the internal circuit 4 is not in the power-down mode.

Figure 5:
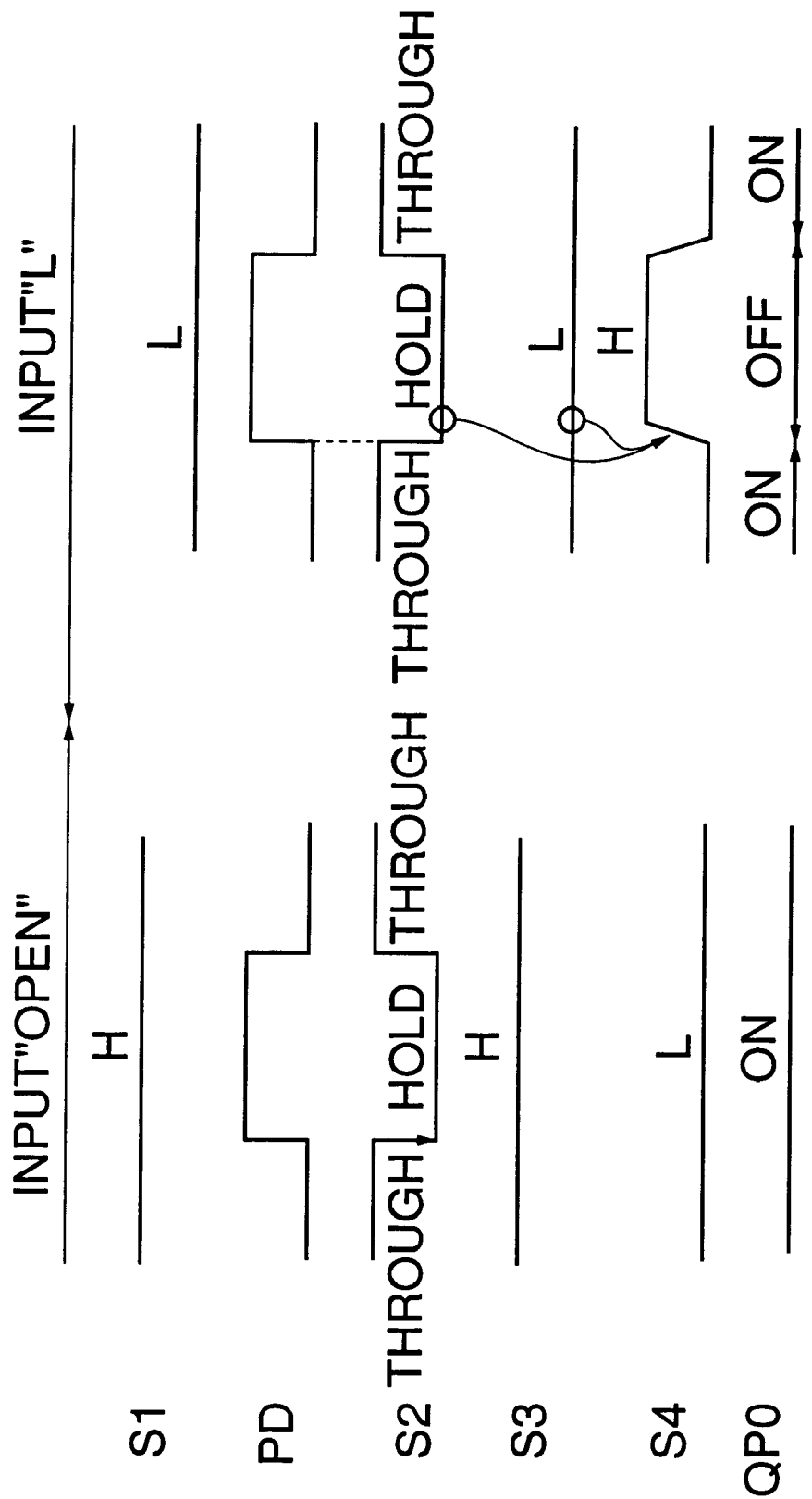
FIG. 5 is a timing chart which is useful in explaining the operation of the semiconductor integrated circuit according to the third embodiment.

FIG. 5 shows the timing of operations of component elements of the input buffer circuit block of the third embodiment, which are related to the power-down control. When the external signal input pad 1 is open (or at "H" level) and hence the output signal S1 from the input buffer circuit 3 is at "H" level, if the power-down control signal PD is changed into "H" level, the output signal S3 from the half latch 7 remains at "H" level and hence the output signal S4 from the NOR gate 5 remains at "L" level. As a result, the PMOS transistor QP0 as the pull-up resistor is held in an ON state.

When the potential at the external signal input pad 1 is at "L" level and hence the output signal S1 from the input buffer circuit 3 is at "L" level, if the power-down control signal PD is changed into "H" level, the output signal S3 from the half latch 7 falls into "L" level and hence the output signal S4 from the NOR gate 5 rises into "H" level. As a result, the PMOS transistor QP0 as the pull-up resistor is turned off.

According to this embodiment, when the external signal input pad 1 is open with the internal circuit in the power-down mode, the PMOS transistor QP0 as the pull-up resistor is never turned off, and hence the potential at the input terminal of the input buffer circuit 3 does not become unstable. On the other hand, when the potential at the external signal input pad 1 is held at "L" level in the power-down mode, the PMOS transistor QP0 as the pull-up resistor is permitted to be turned on, making it possible to minimize wasteful power consumption by the PMOS transistor QP0 as the pull-up resistor.

Figure 6:
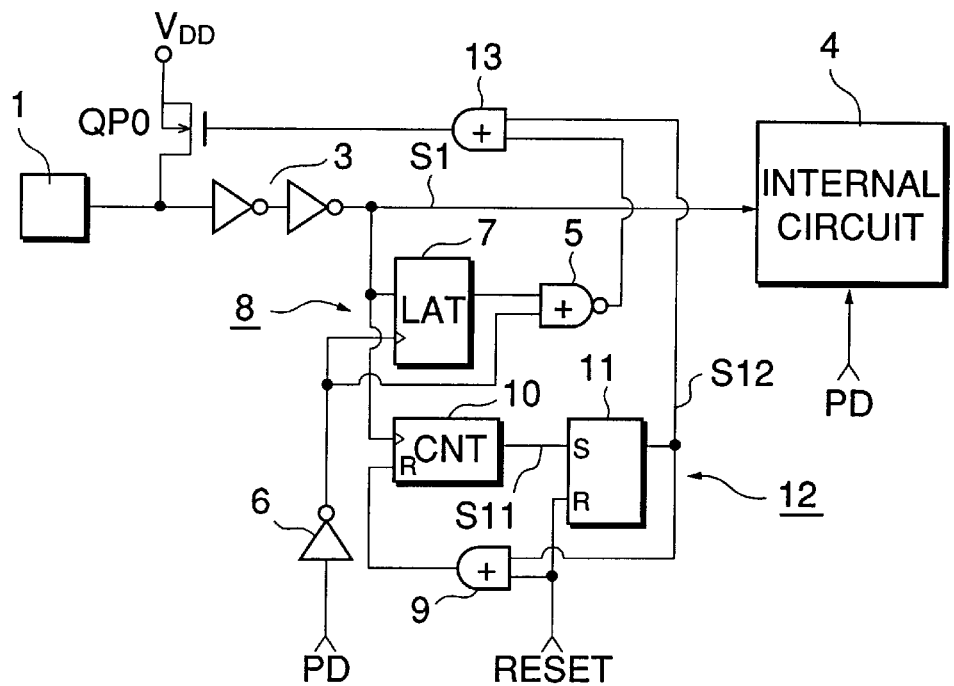
FIG. 6 is a circuit diagram showing essential parts of a semiconductor integrated circuit according to a fourth embodiment of the invention.

FIG. 6 shows the arrangement of essential parts of an input buffer circuit of a semiconductor integrated circuit according to a fourth embodiment of the invention. The input buffer circuit includes, in addition to the state-determining device employed in the third embodiment shown FIG. 4, an active sense circuit 12 as signal state-determining means for determining whether or not the signal level at the external signal input pad 1 is actively changing under predetermined conditions, and turning off the PMOS transistor QP0 as the pull-up resistor, depending upon results of the determination. The active sense circuit 12 includes a counter 10 for counting the number of times the level of the output signal SI from the input buffer circuit 3 changes between the "H" level and the "L" level, and a flip-flop 11 which is set by an output signal S11 from the counter 10. In FIG. 6, symbol RESET represents an initial reset signal such as a power-on reset signal, and the flip-flop 11 is reset by the signal RESET. The counter 10 is reset by an output from an OR gate 9 which performs the logical OR of an output signal S12 from the flip-flop 11 and the signal RESET. The output signal S12 from the flip-flop 11 and an output signal from the state-determining device 8 are sent to the gate of the PMOS transistor QP0 as the pull-up resistor via an OR gate 13.

Figure 7:
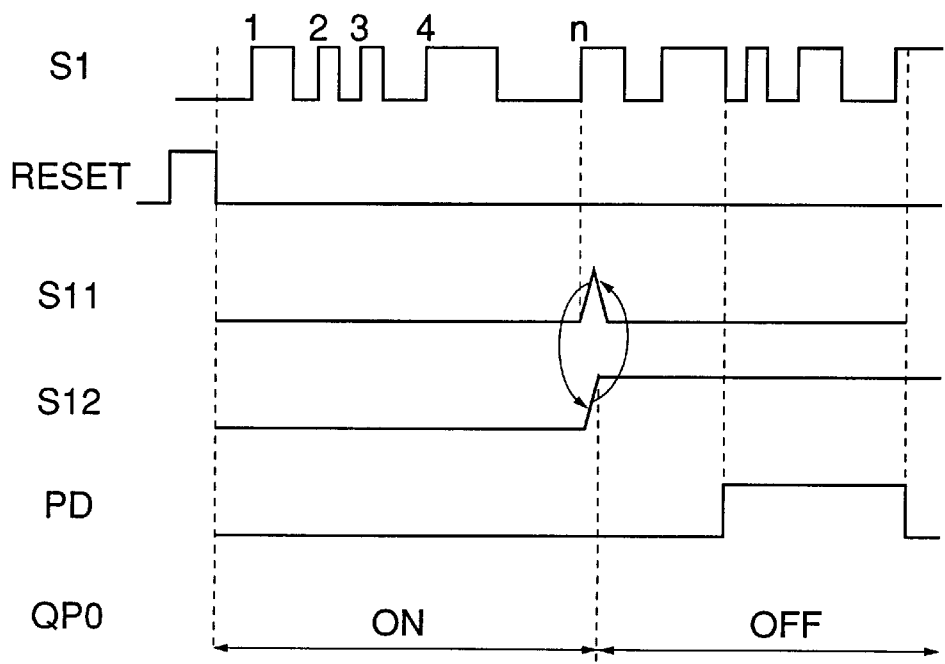
FIG. 7 is a timing chart which is useful in explaining the operation of the semiconductor integrated circuit according to the fourth embodiment.

FIG. 7 shows the timing of operations of component elements of the input buffer circuit of FIG. 6. After the counter 10 and the flip-flop 11 are reset by the signal RESET, the count of the counter 10 is incremented upon each rise of the output signal S1 from the input buffer circuit 3 which alternately rises and falls with repetition of changes in the level of an external input signal input to the external signal input pad 1 between the "H" level and the "L" level. When the counter 10 counts up a predetermined number, e.g. a number n, the level of the output signal S11 from the counter 10 changes into "H" level, to thereby set the output signal S12 from the flip-flop 11 to "H" level. Thus, the active state of the external signal is detected. The output signal S12 from the flip-flop 11 thus set to "H" level is applied to a reset terminal R of the counter 10 via the OR gate 9, to immediately reset the counter 10. Thereafter, the flip-flop 11 does not operate until another reset signal RESET is input. And, the "H"-level output signal from the flip-flop 11 is sent to the PMOS transistor QP0 via the OR gate 13 to turn the PMOS transistor QP0 off.

Once the active sense circuit 12 detects the active state of the external input signal to turn the PMOS transistor QP0 off, even if the level of the external input signal repeatedly changes between the "H" level and the "L" level thereafter, no current flows through the PMOS transistor QP0 during a time period when the external input signal is at "L" level. During an active time period when the external input signal repeatedly changes in level between the "H" level and the "L" level, the potential at the input terminal of the input buffer circuit 3 does not become unstable. Therefore, by holding the PMOS transistor QP0 in the OFF state, it is possible to prevent a current from wastefully flowing through the PMOS transistor QP0 during the time period when the external input signal is at "L" level.

As shown in FIG. 7, after the active state of the external input signal is detected to turn the PMOS transistor QP0 off, a change in the level of the power-down control signal PD does not have any influence on the state of the input buffer circuit. In other words, the active sense circuit 12 used in the present embodiment is useful as a pull-up resistor controller irrespective of whether the internal circuit is in the power-down mode. That is, although the fourth embodiment shown in FIG. 6 is provided with the state-determining device 8 similar to that of the FIG. 4 embodiment so as to enable the fourth embodiment to cope with the power-down mode of the internal circuit in which the external signal input pad 1 is made open, for instance, the state-determining device 8 may be omitted from the FIG. 6 embodiment without spoiling the effect peculiar to the present embodiment.

Figure 8:
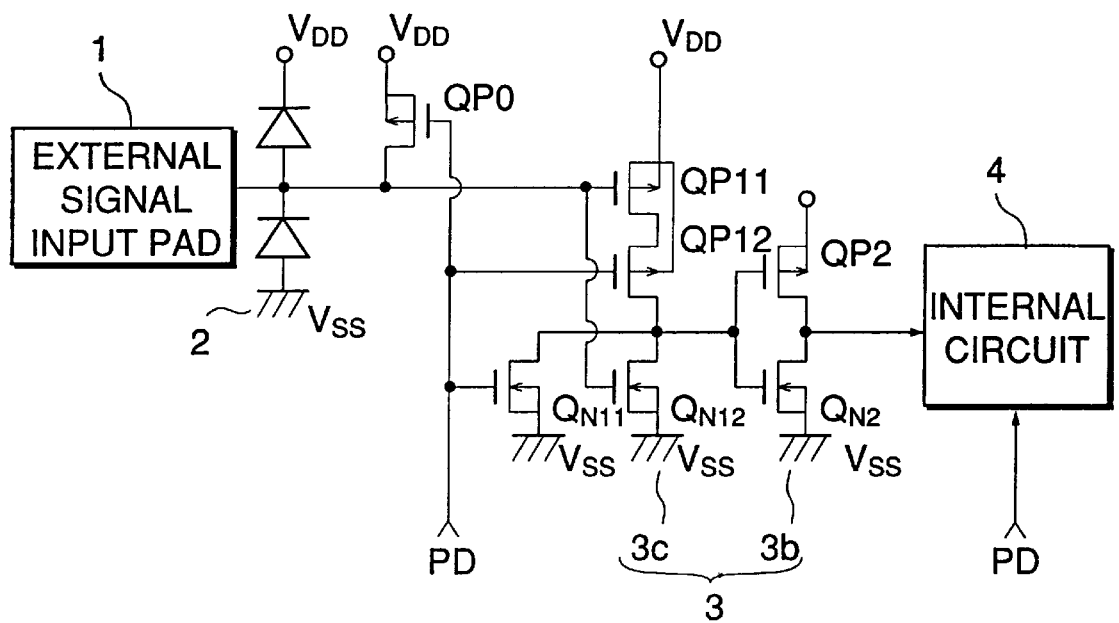
FIG. 8 is a circuit diagram showing essential parts of a semiconductor integrated circuit according to a fifth embodiment of the invention.

FIG. 8 shows the arrangement of essential components of an input buffer circuit of a semiconductor integrated circuit according to a fifth embodiment of the invention. The fifth embodiment is constructed so as to minimize power consumption resulting from a current flowing through the input buffer circuit 3 with the internal circuit in the power-down mode. This embodiment is basically similar in construction to that of the first embodiment shown in FIG. 2 but is distinguished from the latter in that the first-stage inverter 3a of the input buffer circuit 3 is replaced by a two-input NOR gate 3c. A PMOS transistor QP11 and an NMOS transistor QN12 have respective gates forming input terminals of the NOR gate 3c, which are connected to the external signal input pad 1, whereas a PMOS transistor QP12 and an NMOS transistor QN11 have respective gates forming the other input terminals of the NOR gate 3c, which serve as control terminals to which the power-down control signal PD is applied to inhibit a state transition of the input buffer circuit from occurring during the power-down mode.

In this embodiment, in the power-down mode in which the power-down control signal PD is at "H" level, the PMOS transistor QP12 is held in an OFF state and the NMOS transistor QN11 in an ON state, whereby even if an AC signal whose level repeatedly changes between an "H" level and an "L" level is applied to the external signal input pad 1, no transition occurs in the state of the input buffer circuit 3. As a result, no current is caused to flow through the input buffer circuit 3 by such a transition in the state of the input buffer circuit 3. This makes it possible to reduce average power consumption which normally takes place with switching operation of the input buffer circuit 3 in an amount proportional to the frequency of the input signal. This cooperates with the reduction of the power consumption through the control of the PMOS transistor QP0 as the pull-up resistor, to largely reduce the power consumption of the semiconductor integrated circuit.

Figure 9:
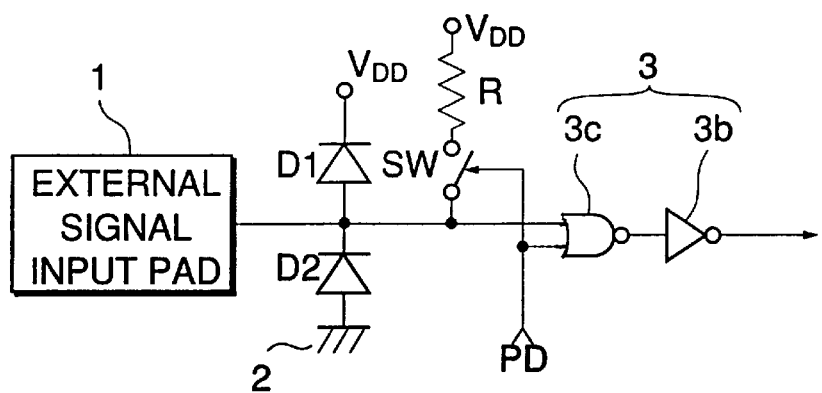
FIG. 9 is a circuit diagram showing an equivalent circuit to the semiconductor integrated circuit according to the fifth embodiment.

FIG. 9 shows an equivalent circuit which is obtained by rewriting the FIG. 8 circuit of the fifth embodiment in an equivalent form. The PMOS transistor QP0 as the pull-up resistor is represented by a resistor R and a switch SW. The power-down control signal PD controls the switch SW and is applied at the same time to the terminals of the NOR gate 3c forming the first stage of the input buffer circuit 3 as a control signal for inhibiting a transition in the state of the circuit 3.

The NOR gate 3c may be replaced by another logic gate, such as AND, OR, NAND or the like, which is capable of similarly inhibiting the switching operation of the input buffer circuit 3 by the power-down control signal PD applied thereto.

What is claimed is:

1. In a semiconductor integrated circuit including an input buffer circuit having an input terminal connected to an external signal input pad, and an output terminal, a reference potential terminal that has a reference potential, and a level-setting resistor having one end thereof connected to said reference potential terminal and having another end thereof connected to said input terminal, the improvement comprising a signal state-determining device connected to said output terminal of said input buffer circuit that determines whether a level of an input signal applied to said external signal input pad has changed a predetermined number of times after application of a reset signal to said signal state-determining device and generates a control signal when said predetermined number is reached, and wherein said level-setting resistor comprises a transistor that is switched from an on state to an off state by said control signal.

2. In a semiconductor integrated circuit including an input buffer circuit having an input terminal connected to an external signal input pad and an output terminal, said semiconductor integrated circuit being responsive to a control signal for setting said semiconductor integrated circuit to a power-down mode, the improvement wherein said input buffer circuit comprises:

a logical gate having a first stage and a second stage, said first stage including a NOR gate having an input terminal other than said input terminal connected to said external signal input pad said NOR gate input terminal coupled to receive said control signal; and wherein said semiconductor integrated circuit is set to said power down mode in response to the control signal such that a state transition of said first stage between an ON state and an OFF state is inhibited from occurring.

3. In a semiconductor integrated circuit including an input buffer circuit having an input terminal connected to an external signal input, and an output terminal, a reference potential terminal that has a reference potential, a level setting resistor having one end thereof connected to said reference potential terminal and having another end thereof connected to said input terminal, and means for setting said semiconductor integrated circuit to a power-down mode by a first control signal, the improvement comprising:

a state-determining device connected to said output terminal of said input buffer circuit that determines whether said external signal input pad is in a predetermined potential state, and generates a second control signal upon determining that said external signal input pad is in said predetermined potential state, said level-setting resistor comprising a transistor that is switched from an on state to an off state by said second control signal: and a signal state-determining device connected to said output terminal of said input buffer circuit that determines whether a number of times a level of an input signal applied to said external signal input pad changes has reached a predetermined number after application of a reset signal to said signal state-determining device, to generate a third control signal when said number of times has reached said predetermined number after the application of said reset signal, said transistor of said level-setting resistor being switched from said on state to said off state by said second control signal and said third control signal.

4. In a semiconductor integrated circuit including an input buffer circuit having an input terminal connected to an external signal input pad and an output terminal, a reference potential terminal that has a reference potential, and a level-setting resistor having one end thereof connected to said reference potential terminal and having another end thereof connected to said input terminal, said semiconductor integrated circuit being responsive to a control signal for setting said semiconductor integrated circuit to a power-down mode, the improvement wherein said level-setting resistor comprises a transistor that is switched from an on state to an off state by said control signal when said external signal input pad is in a predetermined potential state, and said input buffer circuit comprises:

a logical gate having a first stage and a second stage, said first stage including a NOR gate having an input terminal other than said input terminal connected to said external signal input pad said NOR gate input terminal coupled to receive said control signal; and wherein said semiconductor integrated circuit is set to said power-down mode in response to the control signal such that a state transition of said first stage between an ON state and an OFF state is inhibited from occurring.

* * * * *